United States Patent
Akimoto

(10) Patent No.: US 8,178,007 B2
(45) Date of Patent: May 15, 2012

(54) CONDUCTIVE PASTE AND GRID ELECTRODE FOR SILICON SOLAR CELLS

(75) Inventor: Hideki Akimoto, Kanagawa (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/111,025

(22) Filed: May 19, 2011

(65) Prior Publication Data

US 2011/0223712 A1  Sep. 15, 2011

Related U.S. Application Data

(60) Division of application No. 12/719,178, filed on Mar. 8, 2010, now Pat. No. 7,976,735, which is a continuation of application No. 12/072,543, filed on Feb. 26, 2008, now abandoned.

(51) Int. Cl.
*H01B 1/22* (2006.01)
*B05D 5/12* (2006.01)
*H01L 31/0224* (2006.01)

(52) U.S. Cl. .......... 252/514; 427/96.1; 136/256

(58) Field of Classification Search .......... 136/252–256; 252/514; 427/96.1
See application file for complete search history.

(56) References Cited

U.S. PATENT DOCUMENTS

| | | | |
|---|---|---|---|
| 4,001,146 A | 1/1977 | Horowitz | |
| 4,153,907 A * | 5/1979 | Kofron | 257/461 |
| 4,318,830 A | 3/1982 | Horowitz | |
| 4,486,232 A * | 12/1984 | Nakatani et al. | 75/252 |
| 5,096,619 A | 3/1992 | Slack | |
| 5,428,249 A | 6/1995 | Sawayama et al. | |
| 5,464,564 A | 11/1995 | Brown | |
| 5,645,765 A | 7/1997 | Asada et al. | |
| 6,136,230 A | 10/2000 | Sanada | |
| 7,494,607 B2 | 2/2009 | Wang et al. | |
| 7,976,734 B2 * | 7/2011 | Akimoto | 252/514 |
| 7,976,735 B2 * | 7/2011 | Akimoto | 252/514 |
| 2003/0227008 A1 | 12/2003 | Anao | |
| 2006/0231803 A1 * | 10/2006 | Wang et al. | 252/500 |
| 2007/0164260 A1 | 7/2007 | Kuwajima | |
| 2009/0004369 A1 | 1/2009 | Inaba et al. | |

FOREIGN PATENT DOCUMENTS

| | | |
|---|---|---|
| EP | 1009201 A2 | 6/2000 |
| EP | 1713093 A2 | 10/2006 |
| EP | 1713094 A2 | 10/2006 |
| JP | 2006-295197 | 10/2006 |

OTHER PUBLICATIONS

International Search Report for International Application No. PCT/US2009/035099 Dated Aug. 18, 2009.

* cited by examiner

*Primary Examiner* — Mark Kopec

(57) ABSTRACT

A method for producing a solar cell electrode, comprising the steps of: applying on at least part of a light-receiving surface of a semiconductor substrate a conductive paste comprising conductive component, glass frit, and resin binder, wherein the conductive component comprises alloy particles comprising silver and a metal selected from the group consisting of Pd, Ir, Pt, Ru, Ti, and Co; and firing the conductive paste.

4 Claims, 2 Drawing Sheets

CONDUCTIVE PASTE AND GRID ELECTRODE FOR SILICON SOLAR CELLS

This application is a divisional application of Ser. No. 12/719,178 filed on Mar. 8, 2010, now U.S. Pat. No. 7,976,735, which is a continuation of Ser. No. 12/072,543, filed on Feb. 26, 2008 now abandoned.

BACKGROUND OF INVENTION

1. Field of the Invention

The present invention relates to a conductive paste for a solar cell, and more particularly, to an electrically conductive paste used to form grid electrodes for Si solar cell.

2. Technical Background

Silver paste is widely used for the electrode paste used in silicon solar cells, since electrode pastes for solar cells are required to have low electrical resistance to facilitate improved efficiency.

In the case of silicon solar cells in which electrodes are formed on both sides, the light receiving side paste usually contains, as basic components, electrically conductive particles in the form of Ag, binder, glass frit and a solvent (see, for example, Japanese Patent Application Laid-open No. 2006-295197). Silver is generally used as the metal powder for grid electrodes in solar cells. In Japanese Patent Application Laid-open No. 2006-295197, examples of electrically conductive particles include metal particles selected from the group consisting of Cu, Au, Ag, Pd, Pt, alloys of Cu, Au, Ag, Pd and Pt, and mixtures thereof.

A typical method for producing solar cell electrodes is to a) print a solar cell paste onto certain locations on a substrate, and b) fire the solar cell paste in a firing furnace. When a screen printing process is used, electrodes for solar cells in which the substrate is crystalline silicon are often fired at a peak temperatures of 750 to 800° C. using a belt type IR furnace.

It would be desirable, in the interest of improving solar cell production efficiency, to fire several solar cells at the same time, in a large-scale firing furnace. However, a certain degree of variation in temperature can occur in firing furnaces, which can adversely affect the solar cell conversion efficiency. When electrode paste is used for ceramic substrates, degree of variation in firing temperature only affects on line resistance slightly. In solar cells, however, the variation is an element directly related to conversion efficiency, which is a key factor related to the quality of solar cells, and even a small reduction would be welcome.

When currently available electrode paste is used, there is about 30° C. of variance in the firing conditions that are considered suitable in terms of conversion efficiency. Outside of this temperature range, the conversion efficiency decreases precipitously. One reason that the conversion efficiency of solar cells is dependent on the firing temperature range is that a good electrical connection between the electrodes and solar cell substrate occurs within a particular temperature range and such a good connection is not obtained when firing takes place outside the suitable firing temperature range. When large-scale firing furnaces are used, requiring a narrow temperature range leads to lower yields. A more expanded range of suitable firing temperatures would be desirable both for large scale firing arrangements and where small-scale firing furnaces are used.

SUMMARY OF THE INVENTION

The present invention expands the firing temperature range for grid electrodes in crystalline silicon solar cells. In the present invention, specific metals are added, in addition to use of silver, as metal conductors. These specific metals may be used in the form of metal particles, alloy particles, or as coating for plating or the like.

In the present invention, the addition of specific metals makes it possible to expand the firing temperature ranges, within which a good electrical connection can be obtained between the electrodes and solar cell substrate. Solar cells with high conversion efficiency can thus be obtained within a border firing temperature range than was possible in the past.

Specifically, the present invention is a conductive paste for grid electrodes in solar cells comprising a conductive component, glass frit, and resin binder, wherein the conductive component is selected from the group consisting of (i) silver particles and metal particles selected from the group consisting of Pd, Ir, Pt, Ru, Ti, and Co, (ii) alloy particles comprising silver and metal selected from the group consisting of Pd, Ir, Pt, Ru, Ti, and Co and (iii) silver particles and core-shell particles in which a metal selected from the group consisting of Pd, Ir, Pt, Ru, Ti, and Co is coated on the surface of silver or copper.

The present invention is also related to a method for producing solar cell electrodes using the above paste, and to solar cell electrodes formed using the paste.

The paste of the invention can be used at a broad range of temperatures and is suitable for mass production in large-scale firing furnaces.

BRIEF DESCRIPTION OF THE DRAWINGS

FIG. 2 illustrates an example of the electrode layer configuration relating to the invention, where

DETAILED DESCRIPTION OF THE INVENTION

Figure 1:
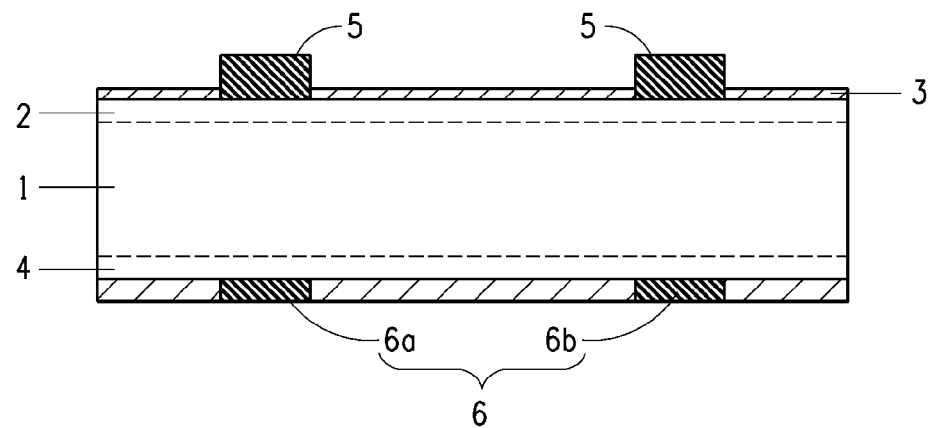
FIG. 1 illustrates the cross sectional structure of the solar cell elements in the invention.

The present invention is a conductive paste for grid electrodes in solar cells comprising (A) conductive component, (B) glass frit, and (C) resin binder as described below.

(A) Conductive Component

In the present invention, the following may be used as the conductive component: (i) a mixture of silver particles and specific metal particles, (ii) alloy particles of silver and a specific metal, or (iii) metal particles surface-coated with silver and a specific metal.

Which form will be used will be determined in consideration of conductivity, availability, stability, cost, and the like. Silver is a metal with lower electrical resistance among metals, and the absolute amount of metal powder added is preferably lower out of concern for lower conductor resistance. The addition of alloy powder or coating powder to the paste can be expected to result in lower resistance and better electrical contact.

An embodiment of the combined use of silver particles and specific metal particles is described below.

Silver (Ag) particles are used as an electrically conductive metal. The silver particle may be in the shape of flakes, spheres or may be amorphous. Although there are no particular limitations on the particle diameter of the silver particles, from the viewpoint of technical effects in the case of being used as an ordinary electrically conductive paste, particle diameter has an effect on the firing characteristics of the silver (for example, silver particle having a large particle diameter are fired at a slower rate than silver particle having a small particle diameter). Thus, although the particle diameter (d50) is preferably within the range of 0.1 to 10.0 μm, the particle diameter of the silver particle actually used is determined according to the firing profile. Moreover, it is necessary that the silver particle have a particle diameter suited for methods for applying an electrically conductive paste (for example, screen printing). In the present invention, two or more types of silver particles having different particle diameters may be used as a mixture.

Preferably, the silver has a high purity (greater than 99%). However, substances of lower purity can be used depending on the electrical requirements of the electrode pattern.

Although there are no particular limitations on the silver content provided it is an amount that allows the object of the present invention to be achieved, in the case of silver particle, the silver content is preferably 40 to 90% by weight based on the weight of the paste.

The additional metals to be added are selected from the group consisting of Pd (palladium), Ir (iridium), Pt (platinum), Ru (ruthenium), Ti (titanium) and Co (cobalt). Two or more of these metals can be used in combination. Preferably, Pd is used in terms of high efficiency required of solar cell.

Adding particles of the above specific metals will allow the firing temperature ranges to be expanded. That is, solar cells having high conversion efficiency may be obtained despite some temperature variation in firing furnaces. Solar cells having high conversion efficiency may also be obtained despite deviation from the target firing temperature as a result of imperfect control of the firing furnace. Given the steady progress in the mass production of solar cells, effects such as the above can be considered extremely significant in the actual manufacturing process.

When a metal, such as palladium is added, the added metal and the silicon present in the substrate are expected to react, forming an alloy layer referred to as a silicide in the interface between the electrode and silicon substrate. This alloy layer may have an effect on lowering contact resistance.

In addition, at firing temperatures resulting in the greatest conversion exchange, the alloying of the Al (electrode material on the reverse side) and Si (substrate material) tends to result in protrusions in the form of beads on the reverse side of solar cells. It was conventionally necessary to fire materials at lower temperatures that are less likely to result in protrusions in the form of beads in order to control the formation of such beads. This problem can also be overcome in the present invention.

The amount of specific metal is preferably in the range of 0.01 to 10 wt % and any ranges contained therein, and more preferably 0.05 to 5 wt % based on the weight of the paste. If the amount of specific metal is excessively low, the advantage of the present invention becomes small. In addition, if the amount of specific metal is excessively high, conductor resistance increases, fireability decreases and costs increase. However, the specific metals to be added are inexpensive, and greater amounts may be added if the conductor wiring resistance is low enough.

The mean particle diameter (PSD D50) of the specific metal particles is preferably 0.1 to 20 μm.

Silver may be alloyed with specific metal particles as is described below.

A specific metal is selected from the group consisting of Pd (palladium), Ir (iridium), Pt (platinum), Ru (ruthenium), Ti (titanium) and Co (cobalt). Two or more metals can be used in combination. Preferably, Pd is used in terms of high efficiency of obtained solar cell.

The alloy proportions for the alloy are not particularly limited. Amounts of different metals in the alloy is determined by a number of factors. For example, silver and palladium tend to become alloyed no matter what the proportion in which they are blended. Since palladium is more expensive than silver, a lower palladium content is preferable from the standpoint of cost. A Ag:Pd alloy with wt % Pd preferably between 1 and 30%, more preferably between 5 and 20% may be used.

The alloys of the present invention can be produced by methods known in the art. Commercially available alloys may also be used.

The alloy content is preferred to be 0.01 to 20 wt %, preferably 0.05 to 10 wt %, based on the total amount of the weight of the paste. If the amount of specific metal is excessively low, the advantage of the present invention becomes small. In addition, if the amount of specific metal is excessively high, conductor resistance increases, fireability decreases and costs increase.

The mean particle diameter (PSD D50) of the alloy is preferably 0.1 to 20 μm.

X-ray diffraction will make it possible to determine whether a conductive powder is an alloy or is a mixture of two or more metals. For example, in case of Ag/Pd, when Ag and Pd are not alloyed, the peak characteristic of Ag and the peak characteristic of Pd will each be observed. When alloyed, on the other hand, an alloy peak will be observed between where the Ag peak should be and where the Pd peak should be, depending on the proportion of the Ag and Pd.

In one embodiment core-shell particles are used in addition to silver particles. Core-shell particles are particles in which a specific metal. selected from the group consisting of Pd, Ir, Pt, Ru, Ti, and Co, is coated on the surface of silver or copper.

The proportion of the core-shell structure is not limited. In terms of sufficient effect caused by this embodiment, the surface metal can be low, as low as 1 vol % of conductive powder, for example. The upper limit is not limited, but is preferred to be kept to a minimum to reduce the material cost caused by surface metal.

The conductive powder of the present invention can be manufactured by a conventional method for core-shell material. Commercially available powder can be used.

The shape of the conductive powder is not particularly limited, and may be in the form of spherical particles or flakes (rods, cones, or plates).

The content of the core-shell particle is preferred to be 0.01 to 20 wt %, preferably 0.05 to 10 wt %, based on the total amount of the weight of the paste. If the amount of the core-shell particle is excessively low, the advantage of the present invention becomes small. In addition, if the amount of the core-shell particle is excessively high, conductor resistance increases, fireability decreases and costs increase. However, larger amounts may be added if the specific metal is inexpensive.

The mean particle diameter (PSD D50) of the core-shell particle is preferably 0.1 to 20 μm. Here, the mean particle diameter (PSD D50) means the particle diameter corresponding to 50% of the integrated value of the number of particles when the particle size distribution is prepared. The particle size distribution can be prepared using a commercially available measuring device such as the X100 by Microtrac.

As mentioned hereinbefore, the present invention is characterized in that both silver and specific other metals are used together. The addition of a third conductive particle, which is not included in the concept of silver nor in the list of specific metals, is not precluded. However, the content of the third conductive particles is preferably less than 2 wt % based on the weight of the paste.

(B) Glass Frit

The electrically conductive paste of the present invention preferably contains an inorganic binder in the form of glass frit.

Since the chemical composition of the glass frit is not important in the present invention, any glass frit can be used provided it is a glass frit used in electrically conductive pastes for electronic materials. For example, lead borosilicate glass is used preferably. Lead borosilicate glass is a superior material in the present invention from the standpoint of both the range of the softening point and glass adhesion. In addition, lead-free glass, such as a bismuth silicate lead-free glass, can also be used.

Although there are no particular limitations on the content of the inorganic binder in the form of the glass frit provided it is an amount that allows the object of the present invention to be achieved, it is 0.5 to 15.0% by weight and preferably 1.0 to 10.0% by weight based on the weight of the paste. If the amount of the inorganic binder is less than 0.5% by weight, adhesive strength may become inadequate. If the amount of the inorganic binder exceeds 15.0% by weight, problems may be caused in the subsequent soldering step due to floating glass and so on. In addition, the resistance value as a conductor also increases.

(C) Resin Binder

The electrically conductive paste of the present invention contains a resin binder. In the present description, the concept of a "resin binder" includes a mixture of a polymer and thinner. Thus, an organic liquid (also referred to as a thinner) may be contained in the resin binder. In the present invention, a resin binder containing an organic liquid is preferable, and in the case of high viscosity, an organic liquid can be added separately as a viscosity adjuster as necessary.

In the present invention, any resin binder can be used. Examples of such resin binders include a pine oil solution, ethylene glycol monobutyl ether monoacetate solution or ethyl cellulose terpineol solution of a resin (such as polymethacrylate) or ethyl cellulose. In the present invention, a terpineol solution of ethyl cellulose (ethyl cellulose content: 5 to 50% by weight) is preferably used as a binder. Furthermore, in the present invention, a solvent not containing a polymer, such as water or an organic liquid can be used as a viscosity adjuster. Examples of organic liquids that can be used include alcohols, alcohol esters (such as acetates or propionates), and terpenes (such as pine oil or terpineol).

The content of the resin binder is preferably 10 to 50% by weight based on the weight of the paste.

(D) Additives

A thickener and/or stabilizer and/or other typical additives may be or may not be added to the electrically conductive paste of the present invention. Examples of other typical additives that can be added include dispersants and viscosity adjusters. The amount of additive is determined dependent upon the characteristics of the ultimately required electrically conductive paste. The amount of additive can be suitably determined by a person with ordinary skill in the art. Furthermore, a plurality of types of additives may also be added.

As is explained below, the electrically conductive paste of the present invention has a viscosity within a predetermined range. A viscosity adjuster can be added as necessary to impart a suitable viscosity to the electrically conductive paste. Although the amount of viscosity adjuster added changes dependent upon the viscosity of the ultimate electrically conductive paste, it can be suitably determined by a person with ordinary skill in the art.

The electrically conductive paste of the present invention can be produced as desired by mixing each of the above-mentioned components with a roll mixing mill or rotary mixer and the like. The viscosity of the electrically conductive paste of the present invention is preferably 50 to 350 PaS in the case of using a #14 spindle with a Brookfield HBT viscometer and measuring using a utility cup at 10 rpm and 25° C.

(E) Solvent

Examples of organic solvents which can be used include alcohols such as terpineol ($\alpha$-terpineol, $\beta$-terpineol, etc.), and esters such as hydroxyl group-containing esters (2,2,4-triemthyl-1,3-pentanediol monoisobutyrate, butyl carbitol acetate, etc.).

(F) Manufacturing Process of Solar Cell

The manufacture of the elements of the solar cell of the invention is described below.

Figure 2A:
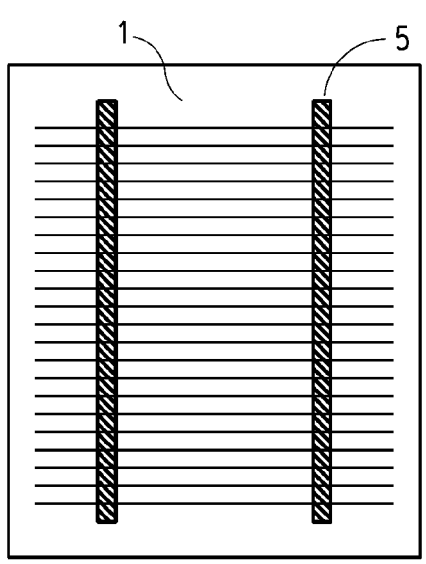
FIG. 2(a) is the light-receiving side (surface)
Figure 2B:
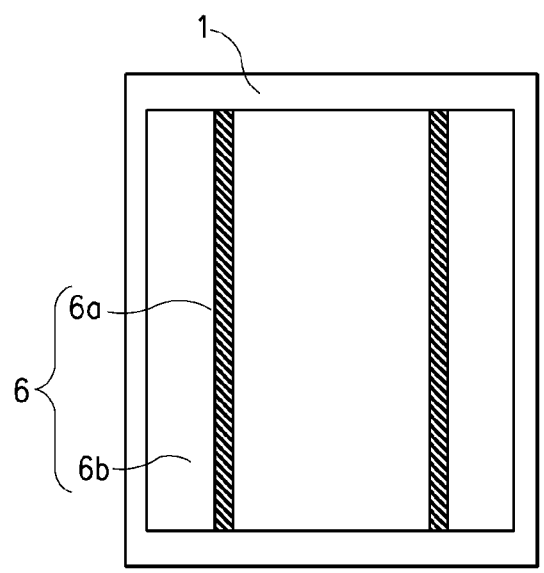
FIG. 2(b) is the side that does not receive light (reverse)

FIG. 1 illustrates the cross sectional structure of the solar cell elements in the invention. FIG. 2 also illustrates an example of the electrode layer configuration relating to the invention, where FIG. 2($a$) is the light-receiving side (surface), and FIG. 2($b$) is the side that does not receive light (reverse).

The semiconductor substrate 1 is composed of monocrystalline or polycrystalline silicon, or the like. The silicon substrate 1 contains p-type dopant such as boron (B), with a resistance of about 0.2 to 2.0 $\Omega$·cm, for example. Monocrystalline silicon substrates are formed by the Czochralski method or the like, and polycrystalline silicon substrates are formed by casting, or the like. Ingots formed by the Czochralski method or casting are cut to a size of about 10 cm×10 cm to 20 cm×20 cm, and are sliced to a thickness of no more than 500 μm, and preferably no more than 250 μm, giving the semiconductor substrate 1.

To clean the sliced surface of the semiconductor 1, the surface is etched with trace amounts of NaOH or KOH, or hydrofluoric acid, hydrofluoronitric acid, or the like.

A textured (roughened surface) structure having the function of lowering the optical reflectance is then preferably formed using dry etching, wet etching, or the like on the surface of the semiconductor substrate that will serve as the incoming light side (light-receiving side).

An n-type diffusion layer 2 is then formed. Phosphorus (P) is preferably used as the doping element for producing the n-type, giving an n+ type with a sheet resistance of about 30 to 300$\Omega$/°, for example. This results in the formation of a pn junction with the p-type bulk area.

The diffusion layer 2 may be formed on the light-receiving side of the semiconductor substrate, or the like, and may be formed, for example, by an application and thermal diffusion method in which $P_2O_5$ in the form of a paste is applied and thermally diffused, a gas phase thermal diffusion method in which POC13 (phosphorus oxychloride) in the form of a gas is used as the diffusion source, an ion implantation method in which p+ ions are directly diffused, or the like. The diffusion layer 2 is formed to a depth of about 0.2 to 0.5 μm.

Additionally, diffusion areas formed in locations where no diffusion is expected can subsequently be eliminated by etching. Parts of the diffusion layer 2 other than on the light-receiving side of the semiconductor substrate 1 may be removed by applying a resist film on the light-receiving side of the semiconductor substrate 1, etching the layer with hydrofluoric acid or a mixture of hydrofluoric acid and nitric acid, and then removing the resist film. Furthermore, when a BSF area 4 is formed with aluminum paste on the reverse side (the side that is not the light-receiving side) as described below, the aluminum, which is a p-type doping agent, can be diffused to an adequate depth at an adequate concentration, thus rendering negligible the effects of shallow n-type diffusion layers that have already been diffused and obviating any particular need to remove n-type diffusion layers formed on the reverse side.

An anti-reflection layer 3 is then formed. SiNx film (there is some latitude in the compositional ratio (x), based on $Si_3N_4$ stoichiometry), $TiO_2$ film, $SiO_2$ film, MgO film, ITO film, $SnO_2$ film, ZnO film, and the like can be used as material for the anti-reflection layer 3. The thickness may be selected in accordance with the semiconductor material, so as to bring about suitable non-reflecting conditions in relation to incident light. A semiconductor substrate 1 that is a silicon substrate, for example, may be about 500 to 1200 Å, with a refractive index of about 1.8 to 2.3.

The anti-reflection layer 3 may be produced by PECVD, deposition, sputtering, or the like. The anti-reflection layer 3 is patterned with a predetermined pattern to form a surface electrode 5 when no surface electrode 4 is formed by the fire-through method described below. Examples of patterning methods which can be used include etching (wet or dry) using a mask such as a resist, and methods in which a mask is pre-formed at the same time that the anti-reflection film 3 is formed and is then removed after the anti-reflection film 3 has been formed. On the other hand, no patterning is needed when what is referred to as the fire-through method is used, wherein a conductive paste for the surface electrode 5 is directly applied and fired onto the anti-reflection film 3 so as to bring about electrical contact between the surface electrode 4 and diffusion layer 2 (FIG. 2A).

The BSF layer 4 is then preferably formed. Here, the BSF layer 4 refers to an area comprising p-type dopant diffused in a high concentration on the reverse side of the semiconductor substrate 1, and has the function of preventing decreases in efficiency caused by carrier recombination. B (boron) and Al (aluminum) can be used as impurity elements, and the impurity element concentration can be increased to a high concentration to produce the p+ type, thereby allowing ohmic contact to be obtained with the reverse side electrode 6 described below.

The surface electrode 5 and reverse side electrode 6 are then formed on the surface and reverse of the semiconductor substrate 1. The electrodes are formed by applying the conductive paste for solar cell elements in the invention using a common application method on the surface of the semiconductor substrate 1 and firing the paste for dozens of seconds to dozens of minutes at a peak temperature of 700 to 850° C. to form electrodes. The conductive paste is also preferably based on silver which has low resistance.

The present invention is particularly significant when the electrode paste is fired in a large-scale firing furnace. When the paste of the invention is used, there will be less of a decrease in yield during production, despite temperature variation in large-scale firing furnaces. Specifically, the present invention is effective in firing furnaces with a conveyor belt width of at least 20 cm, and more effective in firing furnaces with a conveyor belt width of at least 30 cm. To improve productivity in the firing process, several rows of cells are sometimes arranged oriented in the direction in which the belt is conveyed and are fired. In such cases, the necessary belt width is wider than for one row, while also resulting in greater temperature variation in the firing furnace. The paste of the present invention is particularly effective for firing processes with such substantial temperature variation.

EXAMPLES 1) 10 parts ethyl cellulose resin was added to 90 parts terpineol, the mixture was stirred and dissolved for about 2 hours while heated to 80° C., and the solution was then allowed to stand until returned to room temperature, giving a binder solution.

2) 50 parts Pd powder was mixed into 50 parts of the ethyl cellulose resin solution of 1), and the mixture was kneaded with 3 rolls, giving a Pd paste.

3-1) 3 parts of the Pd paste of 2) was added to 100 parts solar cell paste PV145 (Ag paste) by DuPont, and the mixture was stirred to homogeneity in a defoaming stirrer, giving a paste A.

3-2) 50 parts PV145 was added to 50 parts of paste A, and the mixture was stirred to homogeneity in a defoaming stirrer, giving paste B.

3-3) 50 parts of PV145 was added to 50 parts of the paste B, and the mixture was stirred to homogeneity in a defoaming stirrer, giving paste C.

3-4) 50 parts of PV145 was added to 50 parts of the paste C, and the mixture was stirred to homogeneity in a defoaming stirrer, giving paste D.

TABLE 1

|  | Paste A | Paste B | Paste C | Paste D | Paste E |
| --- | --- | --- | --- | --- | --- |
| PV145 (Ag paste) | 100 | 100 | 100 | 100 | 100 |
| Amount of Pd added | 1.5 | 0.75 | 0.375 | 0.1875 | 0 |
| Binder solution | 1.5 | 0.75 | 0.375 | 0.1875 | 0 |

The resulting electrode paste was used to produce a solar cell in the following manner, and the conversion efficiency was then evaluated. The results are given in Table 2.

Sample Preparation

An anti-reflection film and a 1.5 square inch textured monocyrstalline Si wafer for a solar cell were prepared. PV381 by DuPont was applied by screen printing on reverse side of Si wafer and dried in an oven at 150° C./5 min, forming an Al electrode on the reverse side.

Figure 3A:
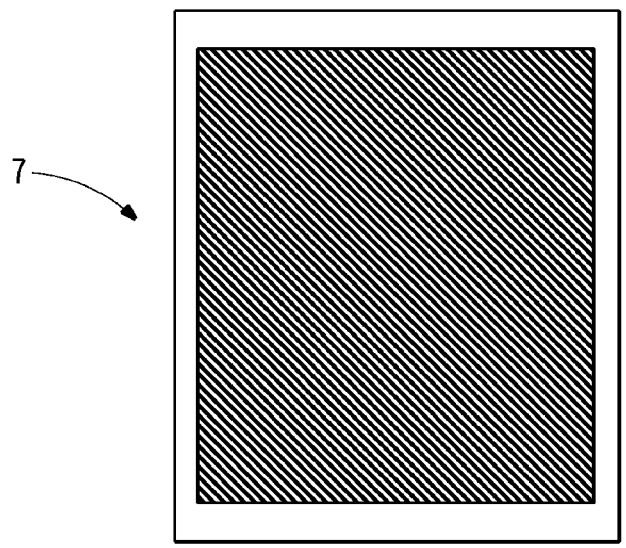
FIG. 3 schematically illustrates the configuration of an Al electrode, 7, on the reverse and a grid electrode, 8, on the surface prepared in an example.
Figure 3B:
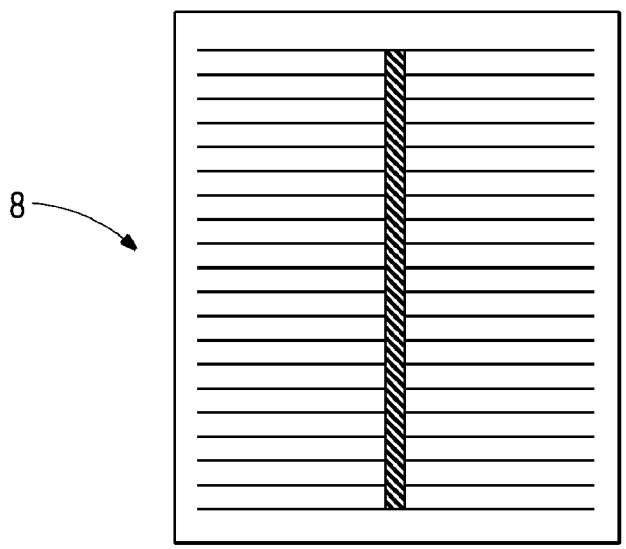

Pastes of examples and comparative examples were applied by screen printing to the light-receiving side of wafers and dried at 150° C./5 min in ovens to form grid electrodes on the surface. The configuration of the reverse side Al electrode and surface grid electrode are given in FIG. 3 for reference.

Firing Conditions

IR heated belt furnaces were used for firing under the following conditions.

Maximum temperature settings: 770° C., 750° C., 740° C., 730° C.

Belt speed: 270 cm/min (Conditions for measuring conversion efficiency)

IV Tester: NTC-M-150A, by NPC

Conditions: AM1.5, temperature: 25° C., radiation intensity: 1000 W/m2

TABLE 2

| Paste | Example 1 paste A | Example 2 paste B | Example 3 paste C | Example 4 paste D | Comparative Example 1 paste E |
| --- | --- | --- | --- | --- | --- |
| Amount of Pd added | 1.5 | 0.75 | 0.375 | 0.1875 | 0 |
| 770° C. | 15.1 | 15.1 | 15.0 | 15.0 | 15.2 |
| 750° C. | 14.7 | 14.7 | 14.4 | 14.8 | 14.9 |
| 740° C. | 14.2 | 14.2 | 13.6 | 13.8 | 12.9 |
| 730° C. | 11.9 | 11.6 | 11.7 | 10.2 | 10.8 |

The tables show that the paste of the invention gave a better conversion efficiency over a broad range of firing temperature conditions. That is, solar cells with a high conversion efficiency can be obtained despite some temperature variation in the firing furnace. Solar cells having a high conversion efficiency are also obtained despite deviation from the target firing temperature as a result of imperfect control of the firing furnace.

What is claimed is:

1. A method for producing a solar cell electrode, comprising the steps of:

applying on at least part of a light-receiving surface of a semiconductor substrate a conductive paste comprising conductive component, glass frit, and resin binder, wherein the conductive component comprises alloy particles comprising silver and a metal selected from the group consisting of Pd, Ir, Pt, Ru, Ti, and Co, wherein the alloy content is 0.01 to 20 wt % based on the total amount of the weight of the paste and wherein mean particle diameter (PSD D50) of the alloy is 0.1 to 20 μm, and firing the conductive paste.

2. A method for producing a solar cell electrode according to claim 1, wherein the firing step is carried out in a firing furnace in which a width of the a moving belt in the firing furnace is at least 20 cm.

3. A method for producing a solar cell electrode according to claim 1, wherein the alloy particles are Ag—Pd particles.

4. A method for producing a solar cell electrode according to claim 3, wherein Pd in the Ag—Pd particles is 1 to 30 wt %, based on the weight of the Ag—Pd particles.

* * * * *